(12) United States Patent
Harvey et al.

(10) Patent No.: US 7,057,388 B2
(45) Date of Patent: Jun. 6, 2006

(54) MAGNETIC RESONANCE METHOD AND DEVICE

(75) Inventors: Paul Royston Harvey, Eindhoven (NL); Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/535,587

(22) PCT Filed: Oct. 27, 2003

(86) PCT No.: PCT/IB03/04794

§ 371 (c)(1),
(2), (4) Date: May 18, 2005

(87) PCT Pub. No.: WO2004/046746

PCT Pub. Date: Jun. 3, 2004

(65) Prior Publication Data

US 2006/0001424 A1    Jan. 5, 2006

(30) Foreign Application Priority Data

Nov. 18, 2002   (EP) .................................. 02079774

(51) Int. Cl.
*G01V 3/00* (2006.01)
(52) U.S. Cl. ....................... 324/309; 324/318
(58) Field of Classification Search ................ 324/309, 324/307, 318, 319, 322, 300; 600/410, 419; 345/419, 420
See application file for complete search history.

(56) References Cited

U.S. PATENT DOCUMENTS 6,076,006 A        6/2000  Van Den Brink
6,307,369 B1 *    10/2001  Felmlee et al. ............. 324/309
6,518,759 B1 *     2/2003  Bernstein ..................... 324/307
6,859,203 B1 *     2/2005  van Muiswinkel et al. . 345/424
2003/0160612 A1 *  8/2003  Yablonskiy et al. ........ 324/309

FOREIGN PATENT DOCUMENTS

EP           1 094 331 A2    4/2001
WO      WO 02/068978 A2     9/2002

OTHER PUBLICATIONS

Bammer, R., et al.; Diffusion-weighted Imaging with Navigated Interleaved Echo-planar Imaging; 1999; Radiology; 211:799-806.

(Continued)

*Primary Examiner*—Brij B. Shrivastav
(74) *Attorney, Agent, or Firm*—Thomas M. Lundin

(57) ABSTRACT

The invention relates to a method for magnetic resonance imaging (MRI) of at least a portion of a body placed in a stationary and substantially homogeneous main magnetic field. The method comprises the steps of subjecting the body to a diffusion-weighting sequence (DW1), generating a train of MR echoes (E1, E2, E3, E4, E5) by an imaging sequence (EPI1), and measuring this train of MR echoes. These steps are repeated until a complete imaging data set with a sufficient number of phase-encoding steps is measured. Thereafter, the imaging data set is corrected for macroscopic motions by means of an individual phase-correction of each train of MR echoes. Finally, an image is reconstructed from the imaging data. In order to provide a method for diffusion-weighted imaging, which requires a minimum additional measurement time for determining the phase errors of the imaging signals and which also guarantees a robust compensation of image artifacts caused by macroscopic motions of the body of the examined patient, the invention suggests to select the phase-encoding scheme of the imaging sequence such that each train of MR echoes (E1, E2, E3, E4, E5) comprises at least one initial MR navigator echo (E1), which forms and integral part of the imaging data set, wherein the phase-correction is derived from the MR navigator echo.

10 Claims, 4 Drawing Sheets

OTHER PUBLICATIONS

Bosak, E., et al.; Navigator motion correction of diffusion weighted 3D SSFP imaging; 2001; MRM in Physics, Biology & Medicine; 12:167-176.

Dietrich, O., et al.; Diffusion-weighted imaging of the spine using radial k-space trajectories; 2001; MRM in Physics, Biology & Medicine; 12:23-31.

* cited by examiner

MAGNETIC RESONANCE METHOD AND DEVICE

The invention relates to a method for magnetic resonance imaging (MRI) of at least a portion of a body placed in a stationary and substantially homogeneous main magnetic field, the method comprising the following steps:

a) subjecting said portion to a diffusion-weighting sequence comprising an initial RF pulse and at least one diffusion gradient pulse;

b) generating a train of MR echoes by subjecting said portion to an imaging sequence comprising read-out gradient pulses and phase-encoding gradient pulses;

c) measuring said train of MR echoes;

d) repeating steps a) to c) until a complete imaging data set with a sufficient number of phase-encoding steps is measured;

e) correcting said imaging data set for macroscopic motions of said portion by means of an individual phase-correction of each train of MR echoes;

f) reconstructing an image from said imaging data set.

Furthermore, the invention relates to a device for magnetic resonance imaging for carrying out this method and a computer program for a magnetic resonance imaging device.

In magnetic resonance imaging (MRI), pulse sequences consisting of RF and magnetic field gradient pulses are applied to an object (a patient) to generate magnetic resonance signals, which are scanned in order to obtain information therefrom and to reconstruct images of the object. Since its initial development, the number of clinical relevant fields of application of MRI has grown enormously. MRI can be applied to almost every part of the body, and it can be used to obtain information about a number of important functions of the human body. The pulse sequence which is applied during an MRI scan determines completely the characteristics of the reconstructed images, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

Known methods of the type specified above are applied in medical diagnostics for the acquisition of MR images of diffusion phenomena in the tissue of the examined object. This may be for example a portion of the brain or the spinal cord of a human patient.

A diffusion-weighted MRI procedure is for example described in the U.S. Pat. No. 6,076,006. According to this known method, an initial slice-selective excitation RF pulse is generated, which is followed by diffusion gradient pulses, in order to obtain diffusion-weighting of the excited nuclear magnetization. Subsequently, a navigator gradient pulse is generated for measuring a MR navigator signal. This navigator gradient pulse is followed by a slice-selective refocusing RF pulse in order to circumvent signal loss, which is due to inhomogeneities of the local magnetic field. Thereafter, a train of MR echoes is generated by an EPI-like imaging sequence comprising a series of alternating read-out gradients and phase-encoding gradients. An imaging data set is obtained by measuring the MR signals, which are generated during multiple repetitions of the described procedure. The measured MR signals are corrected for macroscopic motion by means of a phase-correction. This phase-correction is determined from the phases of the MR navigator signals, which are measured separately in addition to the actual MR imaging signals. After this correction, an image of the examined part of the patient's body is reconstructed, for example by computing a two-dimensional Fourier transformation of the imaging data set.

The main drawback of this known method is that the MR navigator signals are measured separately from the actual imaging data. This results in comparatively long measurement times, and the patient is subjected to additional RF power because of the above-mentioned refocusing RF pulses, which need to be applied immediately before the actual imaging sequence. A further drawback is that because of the delay between the measurement of the MR navigator signal and the measurement of the imaging data, the known method is still susceptible to macroscopic motions of the examined portion of the patient's body.

Therefore, it is readily appreciated that there is a need for an enhanced MRI method, which enables particularly fast and accurate diffusion-weighted imaging. It is consequently the primary object of the present invention to provide a method for diffusion-weighted imaging, which requires a minimum additional measurement time for determining the phase errors of the imaging signals and which also guarantees a robust compensation of image artifacts caused by macroscopic motions of the body of the examined patient.

In accordance with the present invention, a method for magnetic resonance imaging of the type specified above is disclosed, wherein the aforementioned object is achieved by selecting the phase-encoding scheme of the imaging sequence such that each train of MR echoes comprises at least one initial MR navigator echo, which forms an integral part of the imaging data set, wherein the phase-correction is derived from the MR navigator echo of the respective train of MR echoes.

The present invention enables to perform fast tomographic scanning with diffusion-weighting, because the MR navigator echo is measured as an integral part of the actual imaging data. No additional measurement time is required to determine the phase errors of the MR echo signals caused by macroscopic motions. Because in accordance with the present invention, the measurement of the MR navigator echo is embedded into the imaging sequence, there is virtually no time delay between the measurement of the navigator signal and the measurement of the imaging signals. Hence, a particularly robust motion compensation is enabled. According to the invention, the MR navigator echoes are part of the imaging data set and are used together with the remaining imaging signals for the reconstruction of the image in step f). The invention thus provides an MRI method for diffusion-weighted imaging with self-navigating properties.

In accordance with the method of the invention it is advantageously possible to employ only one, two or even more MR navigator echoes per train of MR echoes, which all form an integral part of the imaging data set. A more robust and precise phase-correction may be achieved by deriving phase information from more than only one MR navigator echo, namely from phase-encoded echoes as well as from MR navigator echoes with zero phase-encoding.

With the method of the present invention it is useful if one initial MR navigator echo is generated without phase encoding, wherein each MR navigator echo is followed by a series of phase-encoded MR echoes. In this way, every train of MR echoes begins with a signal, which is not phase-encoded. This signal can be used as a navigator for deriving the phase correction in a known fashion, as it is for example described in the above-mentioned U.S. Pat. No. 6,076,006. Due to the fact that the MR navigator echo is integral to the image data, as opposed to known navigator schemes where it is separate, and that it is the initial echo of the echo train, it is always the echo with maximum signal amplitude. Hence, the navigation in accordance with the present invention is particularly robust and accurate.

It is advantageous that short echo times can be achieved in accordance with the present invention if each train of MR echoes is generated with constantly increasing or decreasing phase-encoding. This is particularly valid if steps a) to c) are repeated with the imaging sequence comprising one variable phase-encoding step and a subsequent series of fixed phase-encoding steps, such that an interleaved phase-encoding scheme is achieved. In this way, the data acquisition begins for each interleave with an MR echo signal, which is not phase encoded, and continues to more positive or more negative phase-encoding values until a maximum or minimum phase-encoding value is reached. This means that MR navigator echoes with zero phase-encoding are measured during each repetition. Phase differences between these navigator signals are due to macroscopic motions and can easily be used for correcting the phases of the remaining MR echoes of the respective interleave.

A non-linear phase-correction of each train of MR echoes can advantageously be performed in step e), which is calculated from one or more MR navigator echoes of the respective train of MR echoes and corresponding reference MR navigator echoes. In this way, a phase correction is performed for each individual point in space covered by the imaging data set, thereby achieving a particularly effective compensation of macroscopic motion. It is practical to select the first MR navigator echo of the imaging data set as a reference MR navigator echo.

It is easily possible to incorporate the method of the present invention in a dedicated device for magnetic resonance imaging of a body placed in a stationary and substantially homogeneous main magnetic field. Such a MM scanner comprises means for establishing the main magnetic field, means for generating gradient magnetic fields superimposed upon the main magnetic field, means for radiating RF pulses towards the body, control means for controlling the generation of the gradient magnetic fields and the RF pulses, means for receiving and sampling magnetic resonance signals generated by sequences of RF pulses and switched gradient magnetic fields, and reconstruction means for forming an image from said signal samples. In accordance with the invention, the control means, which is usually a microcomputer with a memory and a program control, comprises a programming with a description of an imaging procedure according to the above-described method of the invention.

A computer program adapted for carrying out the imaging procedure of the invention can advantageously be implemented on any common computer hardware, which is presently in clinical use for the control of MRI scanners. The computer program can be provided on suitable data carriers, such as CD-ROM or diskette. Alternatively, it can also be downloaded by a user from an internet server.

The following drawings disclose preferred embodiments of the present invention. It should be understood, however, that the drawings are designed for the purpose of illustration only and not as a definition of the limits of the invention.

In the drawings

Figure 4:
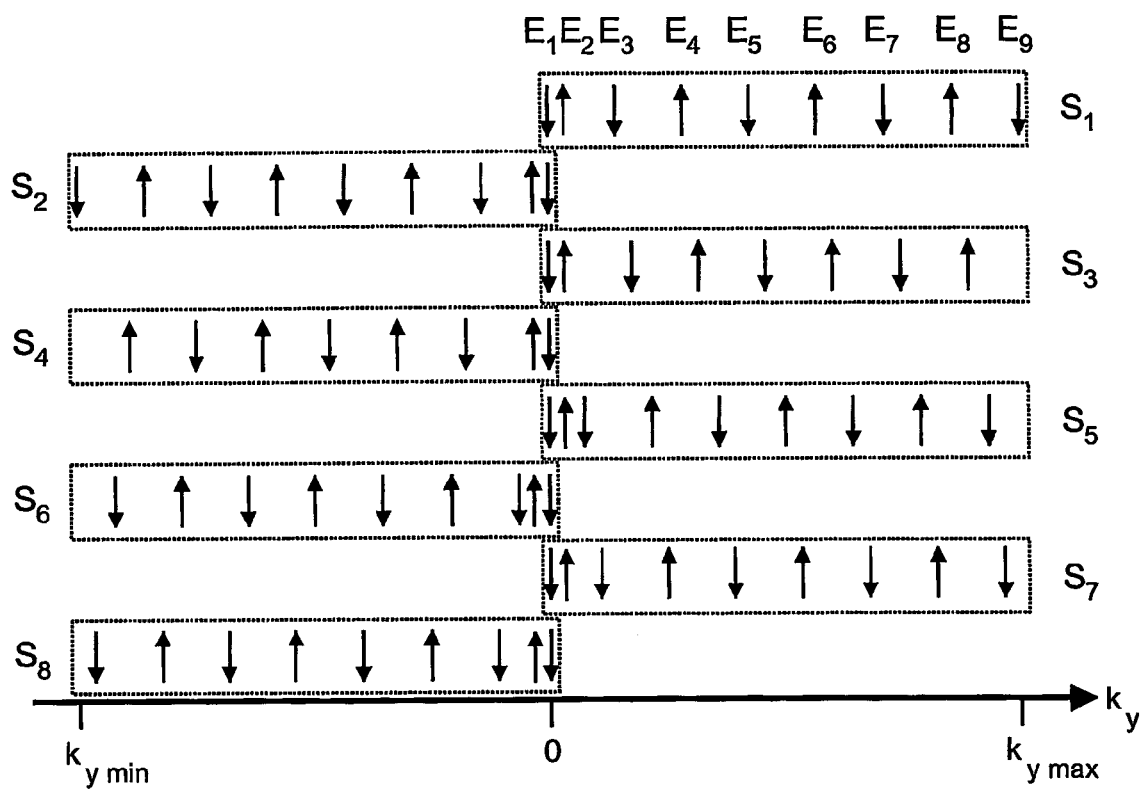

FIG. 4 alternative phase-encoding scheme employing two MR navigator echoes per interleave.

Figure 1:
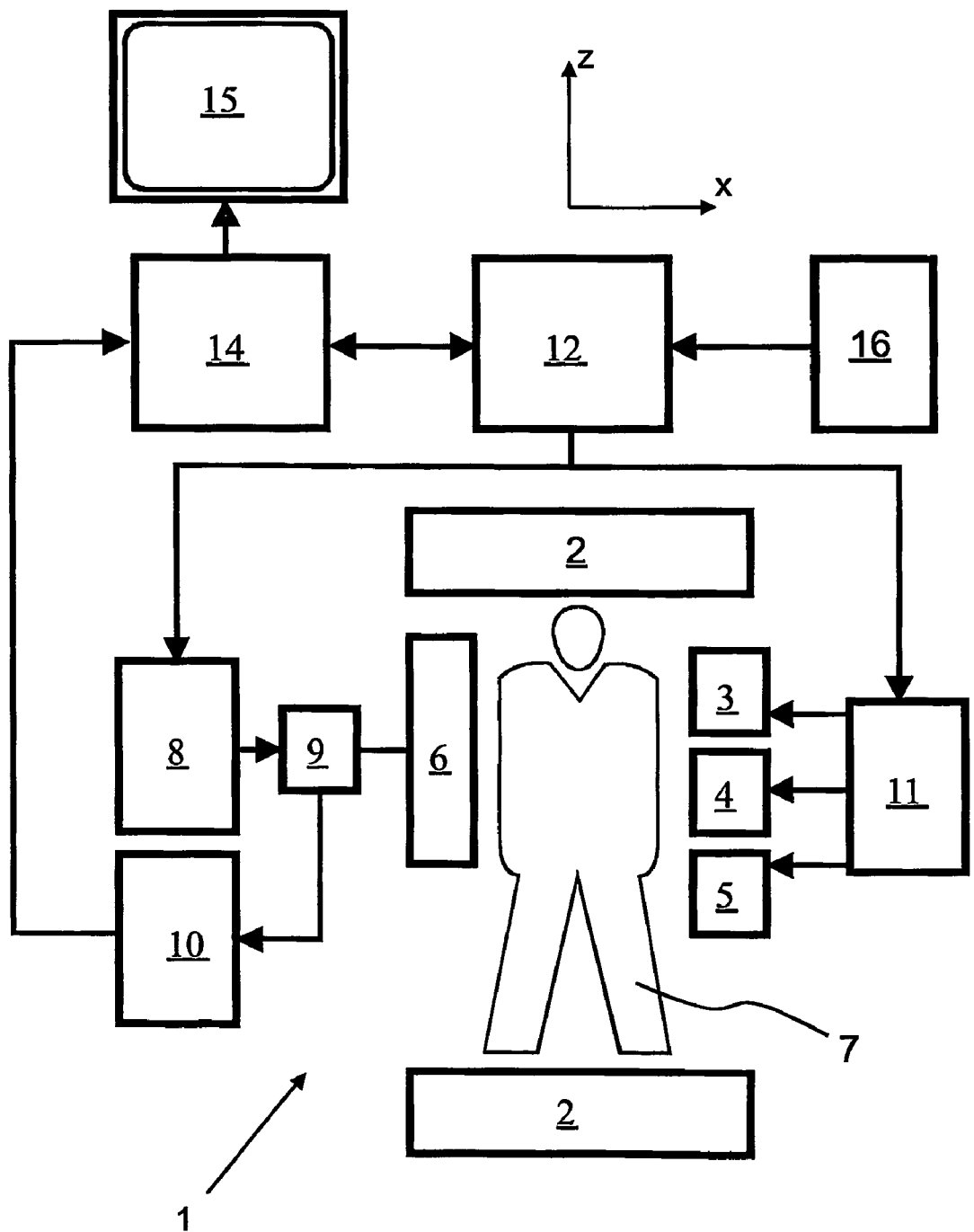
FIG. 1 shows an embodiment of an MRI scanner.

In FIG. 1 a magnetic resonance imaging device 1 is diagrammatically shown. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labeled the z-direction, the two directions perpendicular thereto the x- and y-directions. The gradient coils are energized via a power supply 11. The apparatus 1 further comprises a radiation emitter 6, an antenna or coil, for emitting radio frequency (RF) pulses to a body 7, the radiation emitter 6 being coupled to a modulator 8 for generating and modulating the RF pulses. Also provided is a receiver for receiving the MR-signals, the receiver can be identical to the emitter 6 or be separate. If the emitter and receiver are physically the same antenna or coil as shown in FIG. 1, a send-receive switch 9 is arranged to separate the received signals from the pulses to be emitted. The received MR-signals are input to a demodulator 10. The modulator 8, the emitter 6 and the power supply 11 for the gradient coils 3, 4 and 5 are controlled by a control system 12 to generate the above-described sequence of RF pulses and a corresponding sequence of magnetic field gradient pulses. The control system is usually a microcomputer with a memory and a program control. For the practical implementation of the invention it comprises a programming with a description of an imaging procedure according to the above-described method. The demodulator 10 is coupled to a data processing unit 14, for example a computer, for transformation of the received echo signals into an image that can be made visible, for example on a visual display unit 15. There is an input means 16, e.g. an appropriate keyboard, connected to the control system 12, which enables an operator of the device to interactively adjust the parameters of the imaging procedure.

Figure 2:
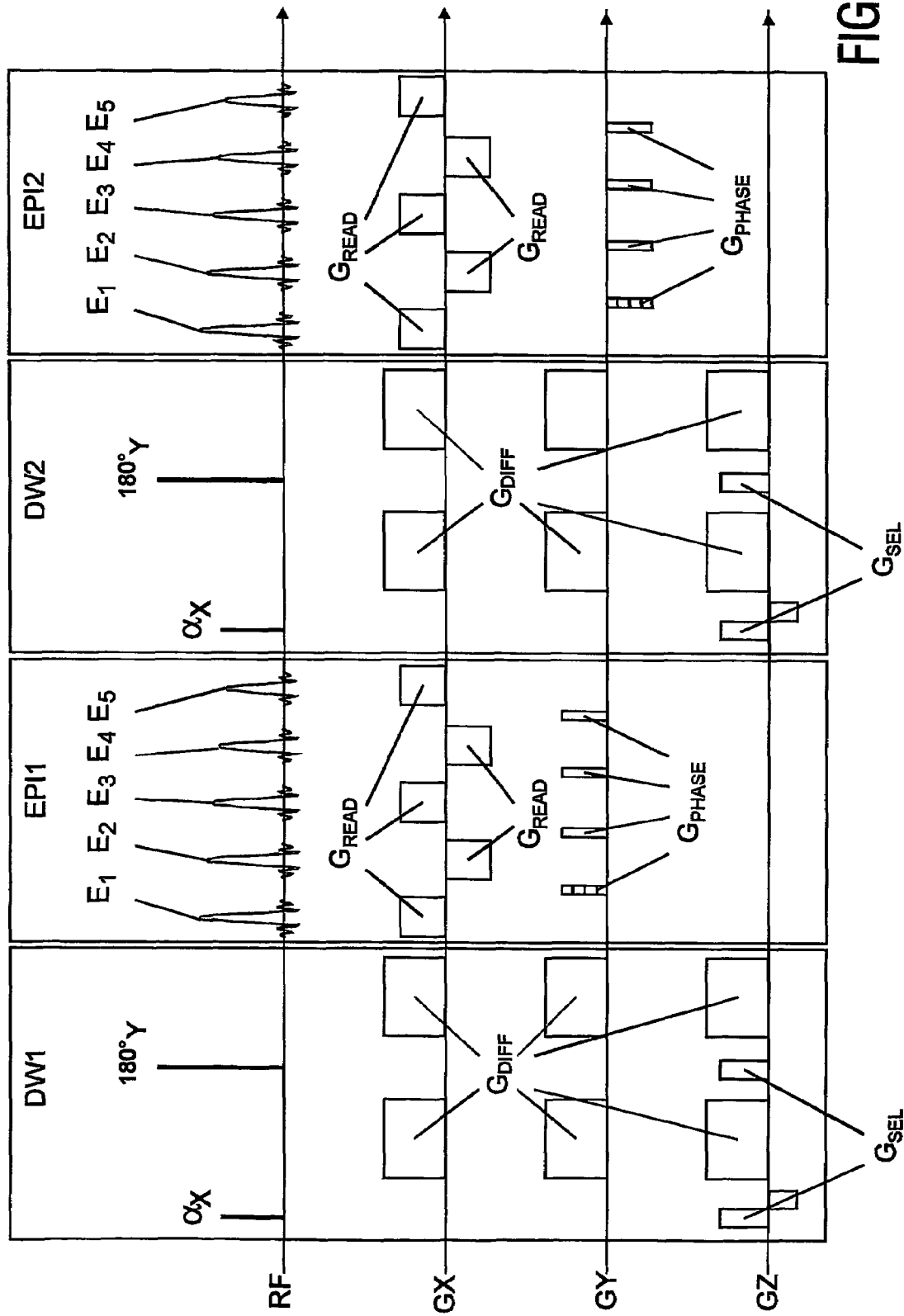
FIG. 2 shows a diffusion-weighted EPI pulse sequence in accordance with the method of the invention.

A sequence design in accordance with the method of the present invention is depicted in FIG. 2. The diagram shows the temporal succession of radio frequency pulses RF and of magnetic field gradient pulses GX, GY, GZ in three orthogonal directions. A patient placed in a stationary and substantially homogeneous main magnetic field is subjected to these pulses during the MRI procedure of the invention. The shown procedure begins with a first diffusion-weighting sequence DW1 comprising an initial excitation RF pulse $\alpha_x$ and a refocusing RF pulse $180°_y$. Slice-selection gradient pulses $G_{SEL}$ in the z-direction are generated simultaneously with the RF pulses. Both after the slice-selective excitation of nuclear magnetization and after refocusing, diffusion gradients $G_{DIFF}$ are generated in order to obtain diffusion-weighting. A train of MR echoes E1, E2, E3, E4, E5 is generated by a first imaging sequence EPI1 comprising alternating read-out gradient pulses $G_{READ}$ and phase-encoding gradient pulses $G_{PHASE}$. The imaging sequence EPI1 is followed by a second diffusion-weighting sequence DW2 and a subsequent second imaging sequence EPI2, such that a "multi-shot" diffusion weighted EPI-sequence is realized, wherein an alternating series of diffusion-weighting and imaging sequences is generated. These steps are repeated until a complete imaging data set with a sufficient number of phase-encoding steps is obtained by measuring each train of MR echoes E1, E2, E3, E4, E5 and E6, E7, E8, E9, E10 and so on. The phase-encoding gradients $G_{PHASE}$ are generated such that each train of MR echoes comprises an initial MR navigator echo E1 or E6, which is not phase-encoded and which forms an integral part of the imaging data set. According to the invention, phase-corrections are derived from the MR navigator echoes E1 and E6. The image data set is corrected for macroscopic motions of the examined patient by an individual phase-correction of each train of MR echoes. Finally, an image is reconstructed from the phase-corrected imaging data set. As can be further seen in FIG. 2, the initial MR navigator echoes E1, E6 are followed by a series of phase-encoded MR echoes E2, E3, E4, E5 or E7, E8, E9, E10, respectively. By the imaging sequence EPI1, which employs magnetic field gradient pulses $G_{PHASE}$ in the positive y-direction, a train of MR echoes with constantly increasing phase-encoding is generated, while a train of MR echoes with constantly decreasing phase-encoding is generated by the second imaging sequence EPI2, which employs gradient pulses $G_{PHASE}$ in the negative y-direction. The imaging sequences EPI1 and EPI2 both comprise an initial phase-encoding gradient with variable gradient strength and a subsequent series of gradient pulses with fixed gradient strength, such that an interleaved phase-encoding scheme is achieved by the depicted "multi-shot" imaging scheme.

Figure 3:
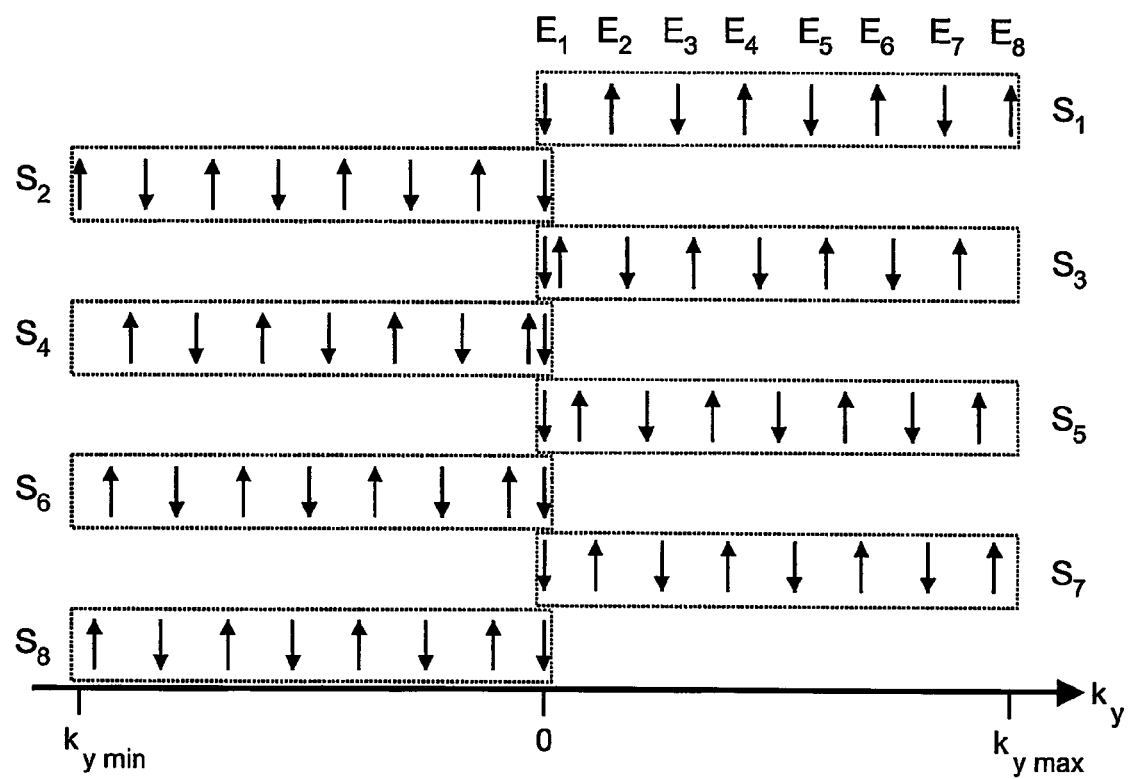
FIG. 3 illustrates the k-space trajectory of an interleaved phase-encoding scheme according to the present invention.

The diagram shown in FIG. 3 illustrates the interleaved phase-encoding scheme described above. A k-space trajectory in accordance with the method of the invention is depicted in the diagram. For complete sampling of k-space, eight diffusion-weighted EPI scans S1, S2, S3, S4, S5, S6, S7, S8 are applied, each comprising a train of eight MR echoes E1, E2, E3, E4, E5, E6, E7, E8. Each train of MR echoes comprises an initial echo E1 at $k_y=0$, which is used for deriving the phase-correction data. For acquisition of a sufficient number of phase-encoding steps a "centre-out" incrementation of kis performed alternately to both positive and negative $k_y$ values starting at $k_y=0$ to $k_y=k_{y\;max}$ and $k_y=k_{y\;min}$, respectively. Thereby a robust and accurate navigation and a particularly short echo timing is achieved. Each scan S1, S2, . . . begins with a variable phase-encoding step and a subsequent series of fixed phase-encoding steps, such that the interleaved k-space sampling in the $k_y$-direction is realized as it is shown in FIG. 3.

FIG. 4 shows a modification of the phase-encoding scheme of FIG. 3. Each train of MR echoes comprises nine echo signals E1, E2, E3, E4, E5, E6, E7, E8, E9, wherein the two initial echoes E1, E2 are used as navigator signals. Hence, more than one echo, even three or more echoes can be acquired from central k-space for navigation purposes in accordance with the method of the invention. The echo signal E1 is acquired without phase-encoding, while signal E2 is acquired with a minimum phase-encoding value. The k-space distance between echoes E1 and E2 corresponds to the FOV (field of view), which is to be covered by the imaging procedure. A phase-correction can be derived by matching the central k-space echoes E1 and E2 of each scan S1, S2, S3, S4, S5, S6, S7, S8, such that phase errors over the fall FOV are registered. As shown in FIG. 4, each imaging sequence comprises an initial phase-encoding step at nominal k-space distance in terms of FOV. This initial phase-encoding step is followed by a variable phase-encoding step and a subsequent series of fixed phase-encoding steps at a more than nominal k-space distance. Thereby an interleaved phase-encoding scheme is achieved, such that the full FOV is imaged by combining the signals of the individual scans S1, S2, . . . .

The invention claimed is:

1. Method for magnetic resonance imaging of at least a portion of a body placed in a stationary and substantially homogeneous main magnetic field, the method comprising the following steps:

a) subjecting said portion to a diffusion-weighting sequence comprising an initial RF pulse and at least one diffusion gradient pulse;

b) generating a train of MR echoes by subjecting said portion to an imaging sequence comprising read-out gradient pulses and phase-encoding gradient pulses;

c) measuring said train of MR echoes;

d) repeating steps a) to c) until a complete imaging data set with a sufficient number of phase-encoding steps is measured;

e) correcting said imaging data set for macroscopic motions of said portion by means of an individual phase-correction of each train of MR echoes;

f) reconstructing an image from said imaging data set; wherein the phase-encoding scheme of said imaging sequence is selected such that each train of MR echoes comprises at least one initial MR navigator echo, which forms an integral part of said imaging data set, wherein said phase-correction is derived from said MR navigator echo of the respective train of MR echoes.

2. Method of claim 1, wherein one initial MR navigator echo is generated without phase encoding.

3. Method of claim 2, wherein each train of MR echoes is generated with constantly increasing or decreasing phase-encoding.

4. Method of claim 3, wherein steps a) to c) are repeated with said imaging sequence comprising one variable phase-encoding step and a subsequent series of fixed phase-encoding steps, such that an interleaved phase-encoding scheme is achieved.

5. Method of claim 1, wherein a non-linear phase-correction of each train of MR echoes is performed in step e), which is calculated from said at least one MR navigator echo of the respective train of MR echoes and at least one reference MR navigator echo.

6. Method of claim 1, wherein said diffusion-weighting sequence comprises an RF refocusing pulse.

7. Method of claim 6, wherein said imaging sequence is an EPI (echo planar imaging) sequence, which does not comprise any RF pulses.

8. Device for magnetic resonance imaging of a body placed in a stationary and substantially homogeneous main magnetic field, the device comprising means for establishing said main magnetic field, means for generating magnetic field gradients superimposed upon said main magnetic field, means for radiating RF pulses towards said body, control means for controlling the generation of said magnetic field gradients and said RF pulses, means for receiving and sampling magnetic resonance signals generated by sequences of RF pulses and switched magnetic field gradients, and reconstruction means for forming an image from said signal samples, wherein said control means comprises a programming with a description of an imaging procedure according to the method of claim 1.

9. Computer program with a program code, which enables an imaging procedure to be carried out on a magnetic resonance imaging device, wherein said imaging procedure comprises the following steps:

a) subjecting said portion to a diffusion-weighting sequence comprising an initial RF pulse and at least one diffusion gradient pulse;

b) generating a train of MR echoes by subjecting said portion to an imaging sequence comprising read-out gradient pulses and phase-encoding gradient pulses;

c) measuring said train of MR echoes;

d) repeating steps a) to c) until a complete imaging data set with a sufficient number of phase-encoding steps is measured;
e) correcting said imaging data set for macroscopic motions of said portion by means of an individual phase-correction of each train of MR echoes;
f) reconstructing an image from said imaging data set, wherein the phase-encoding scheme of said imaging sequence is selected such that each train of MR echoes comprises at least one initial MR navigator echo, which forms an integral part of said imaging data set, said phase-correction being derived from said MR navigator echo of the respective train of MR echoes.

10. Computer program of claim 9, wherein each train of MR echoes is generated with constantly increasing or decreasing phase-encoding, wherein steps a) to c) are repeated with said imaging sequence comprising one variable phase-encoding step and a subsequent series of fixed phase-encoding steps, such that an interleaved phase-encoding scheme is achieved.

\* \* \* \* \*